United States Patent [19]

Ozeki

[11] 4,334,781
[45] Jun. 15, 1982

[54] OPTICAL SENSING SYSTEM

[75] Inventor: Takeshi Ozeki, Tokyo, Japan

[73] Assignee: Tokyo Shibaura Denki Kabushiki Kaisha, Kawasaki, Japan

[21] Appl. No.: 156,258

[22] Filed: Jun. 3, 1980

[30] Foreign Application Priority Data

Jun. 8, 1979 [JP] Japan ............................. 54/71282
Jun. 21, 1979 [JP] Japan ............................ 54/77505

[51] Int. Cl.³ .......................... G01J 4/00; G02B 5/23
[52] U.S. Cl. ................................... 356/368; 350/385
[58] Field of Search ................. 350/374, 384, 385; 356/368

[56] References Cited

U.S. PATENT DOCUMENTS 3,302,028  1/1967  Sterzer ............................. 350/385
3,906,343  9/1975  Feldtkeller .

FOREIGN PATENT DOCUMENTS 2442494  4/1976  Fed. Rep. of Germany .
1526896  10/1978  United Kingdom .
1540907  2/1979  United Kingdom .
1544483  4/1979  United Kingdom .

OTHER PUBLICATIONS

Taylor et al., "Electrooptic Analog-to-Digital Conversion Using Channel Waveguide Modulators", Technical Digest, TUC-1, Topical Meeting on Integrated and Guided Wave Optics, 1978.
Control Engineering, vol. 26, No. 2, Feb. 1979, K. James et al., "Fiber Optics: the Way to True Digital Sensors", pp. 30-33, Whole Document.
Proceedings of the 1978 International Optical, Computing Conference, London, May 9, 1978-1979 Ed. IEEE. H. Taylor, "Fiber and Integrated Optical Devices for Signal Processing", pp. 198-202, pp. 198-200; FIG. 1.
Optices Communications, vol. 27, No. 3, Dec. 1978, Amsterdam NL.
H. Bartelt, "Wavelength Multiplexing for Information Transmission", pp. 365-368, Whole Document.
Applied Optics, vol. 17, No. 22, Nov. 15, 1978, New York U.S., B. Danielson, "Optical Fiber Phase Discriminator", pp. 3665-3668.

Primary Examiner—R. A. Rosenberger
Attorney, Agent, or Firm—Oblon, Fisher, Spivak, McClelland & Maier

[57] ABSTRACT

In an optical sensing system, a phase-comparator compares the phase of an output light beam detected by a photo-detector with an input light beam as to whether those are in-phase or out-of-phase, and senses a magnitude of a physical quantity to be measured, which modulates the input light beam. The light produced by the light source is splitted into two light beam components and modulated in its light-intensity by the physical quantity. Both the light beam components are given a time difference $\tau(=(2m+1)/2f$, where $m=1, 2, \ldots n)$ therebetween, are mixed again and are supplied to the photo-detector.

17 Claims, 13 Drawing Figures

INPUT OPTICAL SIGNAL

CHARACTERISTIC OF SENSOR 21

OPTICAL SENSING SYSTEM

The present invention relates to an optical sensing system and, more particularly, to an optical system capable of providing a physical quantity sensed, or a measured quantity, in the form of a digital optical signal.

In a chemical plant and an electrical power equipment, a more sophisticated optical sensing system has been eagerly desired for some reason that in the former case, it has a high stability and is capable of intrinsic safety, that is, capability of preventing an explosion in the plant equipment and in the latter case, it provides no substantially noise caused by an electromagnetic field and needs no grounding. In the application of the optical sensing system into a telemetering system, to improve the accuracy and reliability of measuring a physical quantity, it is desirable to digitize a signal applied from the optical sensing system. In the optical sensing system already proposed, an analog optical signal is detected and converted into an electric signal by a photo-detector and the electric analog signal is converted by an analog-to-digital converter into a digital signal for transmission for a central processing unit (CPU). When an optical fiber is long in this system, that is, in a remote sensing system, the optical signal is remarkably attenuated when it travels through such a long optical fiber. Or the optical transmission characteristic of the optical fiber tends to very. The variation of the transmission characteristic changes the optical signal to deteriorate the accuracy of the measurement.

Accordingly, an object of the present invention is to provide an optical sensing system capable of providing measuring data with a high accuracy and a high reliability, in which a measuring quantity is transferred in the form of a digital optical signal, being free from an attenuation of an optical signal and the intensive change which are possibly caused in the course of the transmission.

According to this invention, there is provided an optical sensing system comprising:

means for generating an input optical signal whose intensity is modulated by an oscillating input signal with a fixed frequency f;

first means for transferring the input optical signal;

sensing means for splitting the input optical signal into two light components, the intensity of at least one component thereof being modulated by a physical quantity to be sensed;

optical power subtracting means for providing a time delay $\tau = (2m+1)/2f$ (m = 1, 2, ... n) between the two light components transferred from said sensing means and composing the two light components to substantially subtract the optical intensity of one light component from that of the other light component and supply the optical power subtracted light beam as an output optical signal;

second means for transferring the output optical signal; and means for detecting the output optical signal supplied from the second means and phase-comparing the output optical signal with the input signal supplied from said input optical signal generating means to generate an in-phase signal or an out-of-phase signal.

The advantages of the foregoing description of the present invention will become more apparent upon reading the accompanying detailed description in connection with the drawings, in which.

Figure 1:
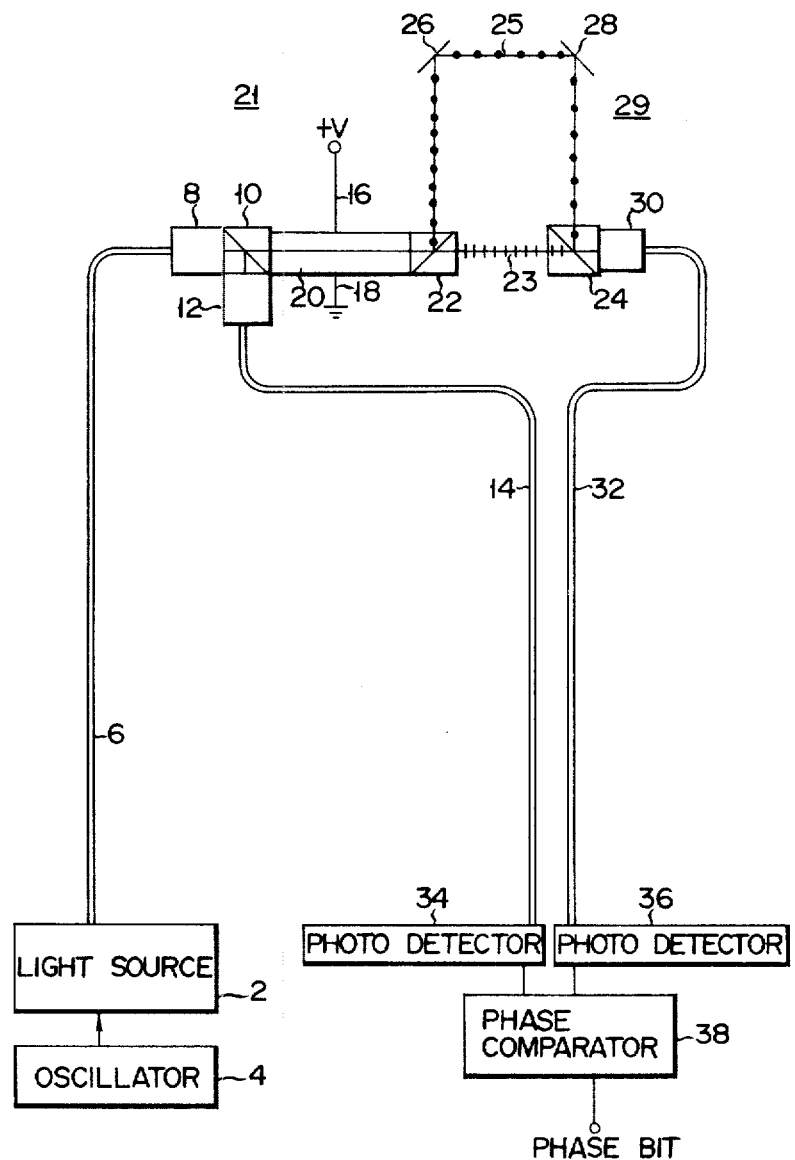
FIG. 1 is a schematic diagram of an embodiment of an optical sensing system according to the invention.

Reference is made to FIG. 1 illustrating an embodiment of an optical sensing system according to the invention. The optical sensing system shown in the figure is of the digital type which is so designed as to provide a binary type optical signal which is in-phase or out-of-phase with respect to a reference optical signal. Note here that the in-phase or the out-of-phase signal is defined as one-phase bit [0, 1] and the definition will frequently be used in the specification. According to the definition, the optical sensing system shown in FIG. 1 is of the one-phase bit type.

Figure 2:
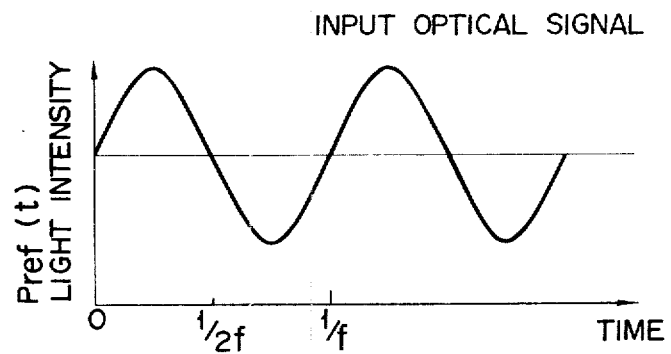
FIG. 2 is a waveform of an input signal supplied to an optical sensor shown in FIG. 1.

The system shown in FIG. 1 is provided with a light source 2, for example, a light emission diode (LED) for emitting an incoherent light beam as an input optical signal. The light beam emitted from the LED 2 has been intensity-modulated by a modulation signal with a frequency f supplied from an oscillator 4, as illustrated in FIG. 2. The light source 2 is optically coupled with one end of the first optical fiber 6 through which the other end of the optical fiber 6 is optically coupled with a collimator 8 for converting an incident light beam into parallel light rays. On the travelling path of those parallel light beams emanating from the collimator 8, a polarizer 10 is disposed for splitting the parallel light beam into two light beam components, ordinary light rays and extraordinary light rays. On the travelling path of one of the split light beam components from the polarizer 10, a launching optics 12 for converting the launched light beam, such as a lens element or a rod lens, is disposed. The launching optics 12 is optically coupled with one end of a second optical fiber 14 which receives the converged light beam and transfers it as a reference optical signal. Disposed on the travelling path of the other split light beam component from the polarizer 10 is an electro-optical crystal 20, for example, $LiTaO_3$, with electrodes 16 and 18 to which a measured voltage, as a voltage sensing element. In the electro-optical crystal, the light beam component linearly polarized by the polarizer 10 is elliptically polarized depending on an impression voltage to be measured. That is, the major axis on the elliptical polarization plane of the elliptically polarized light changes depending on the impression voltage V. An analyzer 22 for splitting the light beam into two light components is disposed on the travelling path of the elliptically polarized light beam. The light intensities of the two light components 23 and 25 splitted by the analyzer 22, that is, ordinary light rays and extraordinary light rays, depends on the double refraction B of the electro-optical crystal 20 and thus the impression voltage V to the crystal 20.

Figure 3:
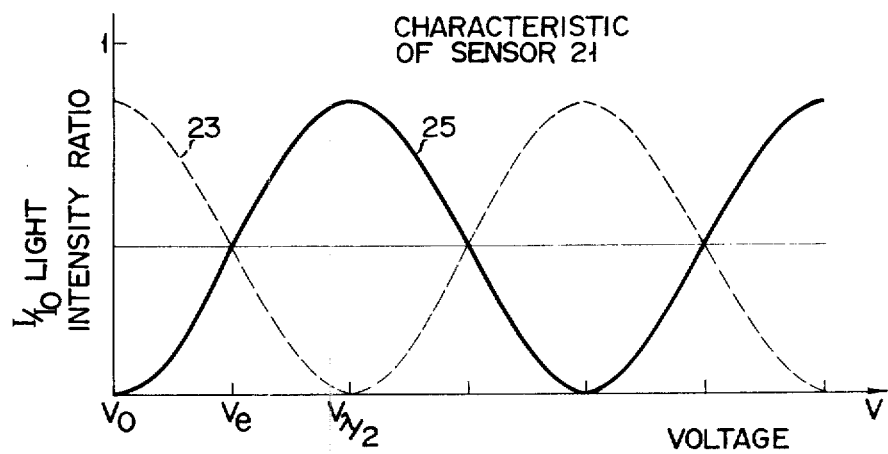
FIG. 3 is a graphical representation of a characteristic of the sensor in FIG. 1.
Figure 4:
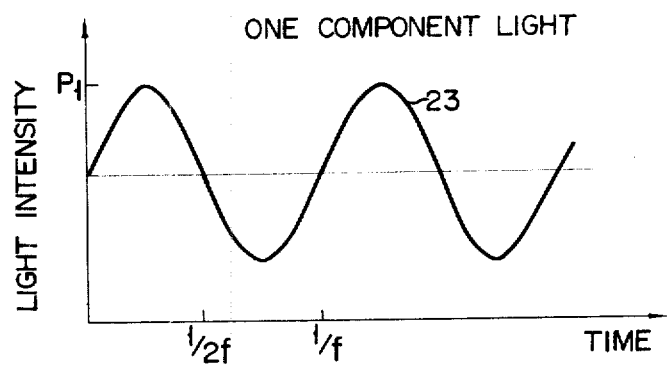
FIGS. 4 and 5 show waveforms of intensity-modulated signals from the sensor shown in FIG. 1.
Figure 5:
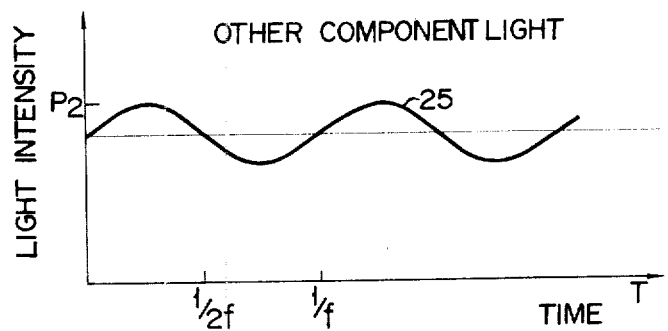

The sensor 21, comprising the polarizer 10, the LiTaO$_3$ crystal 20 and the analyzer 22, has a characteristic as shown in FIG. 3, which is known. In the graph shown in FIG. 3 illustrating a relation between the impression voltage V to the crystal 20 and a ratio I/Io of an intensity of one of the splitted light components to a constant intensity Io of an incident light, a continuous line indicates the ratio of one light component and a broken line indicates the ratio of the other light component. As seen from the graph, the ratio I/Io of the light intensities changes depending on the voltage V in a sinusoidal function manner. When the ratio I/Io of the one light component 23 increases, that of the other light component 25 decreases. Specifically, the intensity of the light component 25 is at maximum at the half-wave voltage $V_{\lambda/2}$ while that of the light component 23 is at minimum. At the voltage Ve, the light intensities of both the components are equal to each other. Accordingly, when the light beam with the frequency f as shown in FIG. 2 transmits through the sensor 21, part of the light beam is split into two light components which are the same in the phase, and have the frequency f and light intensities $P_1$ and $P_2$, as shown in FIGS. 4 and 5. In this case, if a measuring voltage range of the sensor 21 is limited within a range from a voltage $V_0$ to the half-wave voltage $V_{\lambda/2}$, the amplitudes $P_1$ and $P_2$ are modulated by the impression voltage V. When the light intensities $P_1$ and $P_2$ of the two light components are compared within this range, it is known whether the voltage V to be measured is larger or smaller than the voltage Ve.

Figure 6:
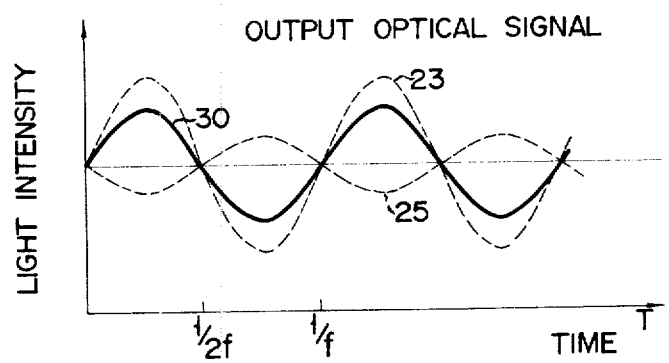
FIG. 6 is a waveform of a composed optical signal from an optical power subtracting unit shown in FIG. 1 in which the signals shown in FIGS. 4 and 5 are composed.

The sensor 21 is optically coupled with an optical power subtracting unit 29, which provides a time difference between the two light components split by the sensor 21 and composes them again whereby the optical power is substantially subjected to a subtraction process. On the travelling path of the light component transmitted through the analyzer 22, a polarizer 24 is disposed for composing two light components 23 and 25. Reflective mirrors 26 and 28, disposed on a travelling path on the other light component 25, reflects the light components and then the reflected light component is projected onto the polarizer 24. The optical path of the other light component 25 extending from the analyzer 22 through the reflective mirrors 26 and 28 to the polarizer 24 is longer than the optical path of the one light component 23 extending from the analyzer 22 to the polarizer 24. The length difference between the optical paths is so selected that the first and second light components has a time difference $\tau = (2m+1)/2f$ (m = 0, 1, 2, ... n), a half period $\frac{1}{2}f$ or a period odd number items, the half period. The light component 23 transmitted through the analyzer 22 and the light component 25 reflected by the analyzer 22 are again combined by the analyzer. In this case, both the light components are polarized optical wave oscillating with the polarization planes which are orthogonal to each other and are incoherent. Therefore, both the light components never interfere with each other and the light intensities of them are substantially subtracted as indicated by a continuous line 30 in FIG. 6. The travelling path of the subtracted light beam is provided with a launching optics 30 for converging the light beam at the third optical fiber 32 optically coupled at one end with the launching optics 30. The other ends of the second and third optical fibers 14 and 32 are coupled with photodetectors 34 and 36 for detecting the light intensities of the reference light beam and the modulated light beam transferred through both the fibers 14 and 32. Those detectors 34 and 36, respectively, supply a reference electric signal and a modulated electric signal, which have the frequency f, as shown in FIGS. 4 and 6, to a phase comparator 38. The phase comparator 38 produces a signal of [1] bit when the reference electric signal and the subtracted modulated electric signal are in phase ($\psi = 0$). It produces an output signal of [0] bit when both signals are out of phase ($\psi = \pi$).

The light intensities Pref(t) of the reference light beam detected by the photo-detector 34 is given by the following equation (1) and the light intensity Pm(t) of the modulated light beam detected by the photo-detector 36 is given by the following equation (2).

$$Pref(t) = P_0 e^{j w t} \qquad (1)$$
$$Pm(t) = (P_1 - P_2) e^{j w t} \qquad (2)$$

where $P_0$ is an amplitude of the reference light beam, $(P_2 - P_1)$ is an amplitude of the modulated light beam. The equation (2) is derived from the following equation (3). The light intensity of the two light components 23 and 25, which have the time difference $\tau$ therebetween and composed by the analyzer 24, is given by the following equation (3).

$$Pm(t) = P_1 e^{j w t} + P_2 e^{j w (t-\tau)} \qquad (3)$$
$$= (P_1 + P_2 e^{j w \tau}) e^{j w t}$$

where $w = 2\pi f$ and $w\tau = \pi(2m+1)$ and m = 0, 1, 2, 3, ... Accordingly, the equation (2) may be derived from the equation (3).

As seen from the equations (1) and (2), when the reference light beam and the modulated light beam are in phase ($\psi = 0$), $P_1 > P_2$. When those beams are out of phase ($\psi = \pi$), $P_1 > P_2$. Accordingly, when the output signal from the phase comparator 38 is [1] bit, $P_1 > P_2$. This indicates that the light intensity of the one light component 23 is larger than that of the other light component 25. On the other hand, when the output signal from the phase comparator 38 is [0] bit, $P_1 > P_2$. This means that the light intensity of the one light component 23 is smaller than that of the other light component 23. If the measuring voltage range of the sensor 21 is within $V_0$ to $V_{\lambda/2}$, the voltage V applied to the sensor 21 is larger than the reference voltage Ve, when the output signal is [1] bit. Under this condition, it is the V is smaller than the Ve when it is [0] bit.

As described above, the embodiment shown in FIG. 1 judges the relative amplitude of the voltage V applied to the sensor 21 in relation to the reference voltage Ve, depending upon the phase relation of the modulated light beam as shown in FIG. 6 to the reference light beam as shown in FIG. 2, that is, upon whether those light beams are in-phase or out-of-phase. Therefore, the optical sensing system of the present embodiment may accurately and reliably measure a physical quantity even if the optical signal is attenuated or intensity-modulated in a long light transmission path, or the long optical fiber.

In the above-mentioned embodiment, the reference light beam is supplied from the light source for the phase-comparison with the modulated light beam, by splitting the input light beam by means of the polarizer 10. However, the modulation electric signal may directly be supplied from the oscillator 4 to the phase comparator 38 for the same purpose. The length of the optical travelling path of the reference light beam is not necessarily exactly equal to that of the modulated light beam modulated by the sensor 21. In this case, a phase difference is caused between both beams. The phase difference caused, however, is not problematic, so long as the relation between the phase bit to the voltage V distinctively holds.

The optical sensing system of the one-phase bit type may detect a state that the voltage at the measuring point exceeds the given voltage Ve. The same system may also detect a state that the temperature at the measuring point reaches a given temperature at the measuring point, when the crystal 20 is substituted by the double refraction crystal, for example. When the sensor 21 is replaced by another suitable means for sensing a physical quantity, such as a magnetic field sensor, a pressure sensor and the like, the optical sensing system may sense various kinds of physical quantity in terms of the phase bit.

Figure 7:
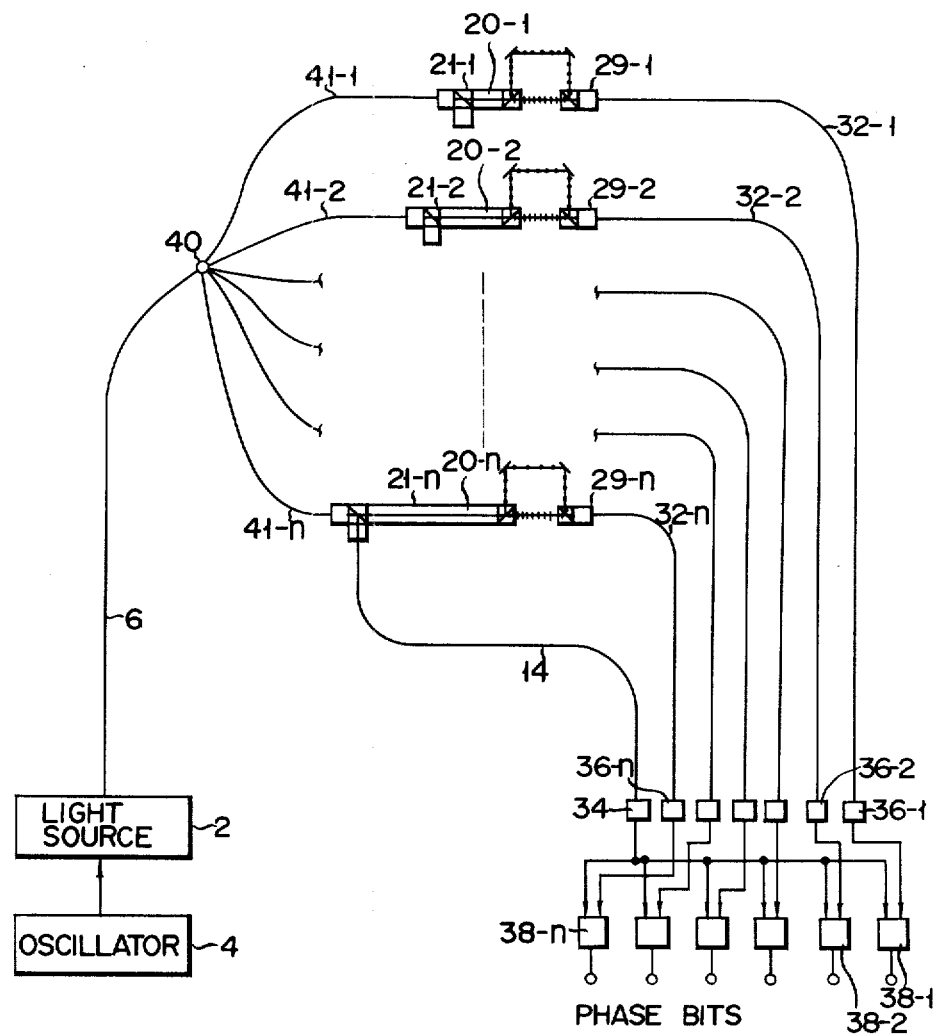
FIG. 7 is a scheme of an optical sensing system of the multi-phase bits type according to an embodiment of the present invention.

Turning now to FIG. 7, there is shown another embodiment of the optical sensing system according to the invention which is a sophisticated version of the embodiment of FIG. 1. Compared to the embodiment of FIG. 1, the number of phase bits is increased and a measuring value is quantitized. No elaboration relating to the portions designated by like symbols in FIG. 1 will be given, for simplicity.

In the optical sensing system shown in FIG. 7, a number of sensors 21-1, 21-2, . . . 21-n are optically coupled with optical power substractors 29-1, 29-2, . . . 29-n, respectively, of subtractors each being comprised of the optical elements 24, 26, 28 which provide a time difference or a time delay $\tau$ between the two light components derived from the corresponding sensor and then compose them again. These subtracters 29-1, 29-2, . . . 29-n are optically coupled with photo-detectors 36-1, 36-2, . . . 36-n, through third fibers 31-1, 32-2, . . . 32-n, respectively. Coupled with at least one sensor 21-n, a second fiber 14 for transferring the reference light beam which is also optically coupled with a photo-detector 34. A reference signal from the photo-detector is applied to phase detectors 38-1, 38-2, . . . 38-n supplied with modulated signals derived from the photo-detectors 38-1, 38-2, . . . 38-n. Optically coupled between the sensors 21-1, 21-2, . . . 21-n and the light source 2, a star coupler 40 supplies an optical signal through the fibers 41-1, 41-2, . . . 41-n to the sensors 21-1, 21-2, . . . 21-n.

Figure 8:
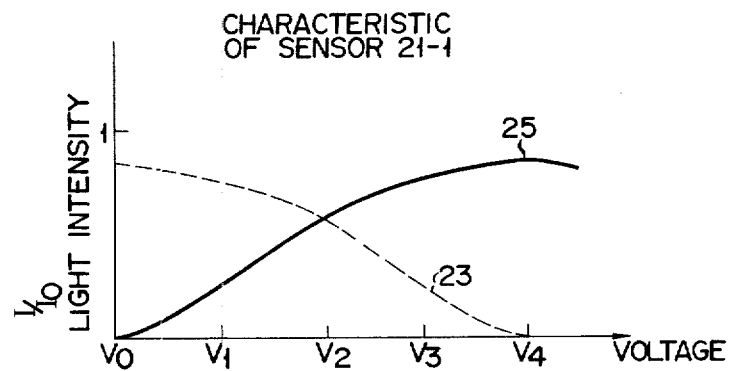
FIGS. 8 and 9 are graphs illustrating characteristics of two sensors shown in FIG. 7.
Figure 9:
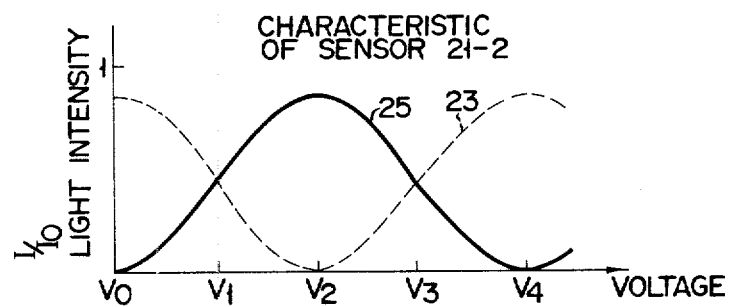

The sensitivities of the sensors 21-1, 21-2, . . . 21-n of the optical sensing system shown in FIG. 7 are made different by using different lengths of the crystals 20-1, 20-2, . . . 20-n. By the length of the crystal 20, a value of the half-wave voltage $V_{\lambda/2}$ changes. The ratio I/Io of the light intensities of the two light components 23 and 25 of the light beam to the impression voltage V, when the length of the crystal 20-1 is L, for example, is shown in FIG. 8. A similar relation when the length of the crystal 20-2 is 2L. The half-wave voltage $V_{\lambda/2}$ of the crystal 20-1 corresponds to the voltage $V_4$. The half-wave voltage $V_{\lambda/2}$ of the crystal 20-2 corresponds to the voltage $V_2$. The phase bit of the optical signals, which are modulated by the sensors 21-1 and 21-2 and supplied from the phase comparators 38-1 and 38-2, is tabulated as in Table I. Here, V designate a voltage at a measuring point which is applied to both the crystals 20-1 and 20-2.

TABLE I

| Voltage | (PHASE BIT) | | | |
|---|---|---|---|---|
| | $V_0<V<V_1$ | $V_1<V<V_2$ | $V_2<V<V_3$ | $V_3<V<V_4$ |
| Output from phase comparator 38-1 | 0 | 0 | 1 | 1 |
| Output from phase comparator 38-2 | 0 | 1 | 1 | 0 |

The measuring voltage V is further quantitized by changing the lengths of the crystals 20-1, 20-2, . . . 20-n of the sensors 21-1, 21-2, . . . 21-n, as seen from Table I.

As described above, the quantitization of a physical quantity to be measured may be attained by changing the characteristics of the sensors 21-1, 21-2, . . . 21-n. Even if the crystals of the sensors 21-1, 21-2, . . . 21-n have the same characteristics, it is possible to quantitize a physical quantity such as a fixed voltage V at the measuring point by changing a physical amount such as voltage applied to the sensors 21-1, 21-2, . . . 21-n, with the interposition of a voltage divider, for example, between the measuring point and sensors.

Figure 10:
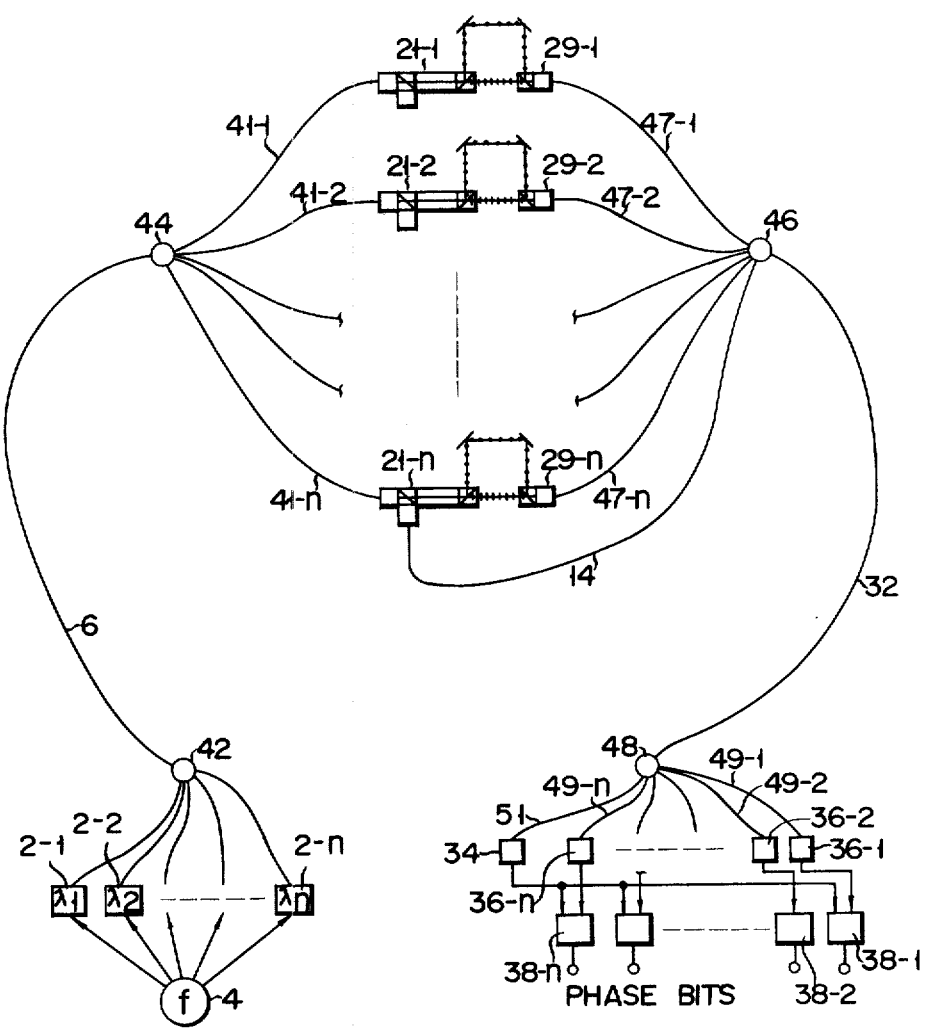
FIG. 10 is a scheme of an optical sensing system of the multi-phase bits type according to another embodiment of the present invention.

Further, it is possible to quantitize a physical quantity to be measured for a multiple of wavelengths, by utilizing the fact that the characteristics of the sensors 21-1, 21-2, . . . 21-n are different for each wavelengths $\lambda_1$, $\lambda_2$, . . . $\lambda_n$, as shown in FIG. 10. In this case, the sensitivity of each sensor may be changed by $2^m$ times (m is 1, 2, . . . m). To this end, light sources 2-1, 2-2, . . . 2-n for generating light beams with different wavelengths $\lambda_1$, $\lambda_2$, $\lambda_3$, . . . $\lambda_n$ are provided. The light beams produced from those sources and intensity-modulated are transferred through the optical fibers 43-1, 43-2, . . . 43-n to a multiplexer 42. Then, the light beams are wavelength-multiplied by the multiplexer 42 and are transferred to a demultiplexer 44 provided in the measuring area, through the fiber 6. The demultiplexer 44 splits again the wavelength-multiplexed light beams into the light beams with different wavelengths which in turn are transmitted through optical fibers 41-1, 41-2, . . . 41-n to the respective sensors 21-1, 21-2, . . . 21-n. The light beams, after passing through the optical power subtracting units 29-1, 29-2, . . . 29-n, pass through the optical fibers 47-1, 47-2, . . . 47-n to enter the multiplexer 46 where those are multiplexed again. The multiplexed ones are transferred through the fiber 32 to the demultiplexer 48 provided at a station remote from the measuring area. The demultiplexer 48 splits again the multiplexed ones into light beams with the different wavelengths. Those splitted ones pass through the fiber 51 and the fibers 49-1, 49-2, . . . 49-n and are detected by photo-detectors 34, 36-1, 36-2, . . . 36-n. As stated previously, the phase comparators 38-1, 38-2, . . . 38-n produces phase bits. As a result, the physical quantity is quantitized.

Figure 11:
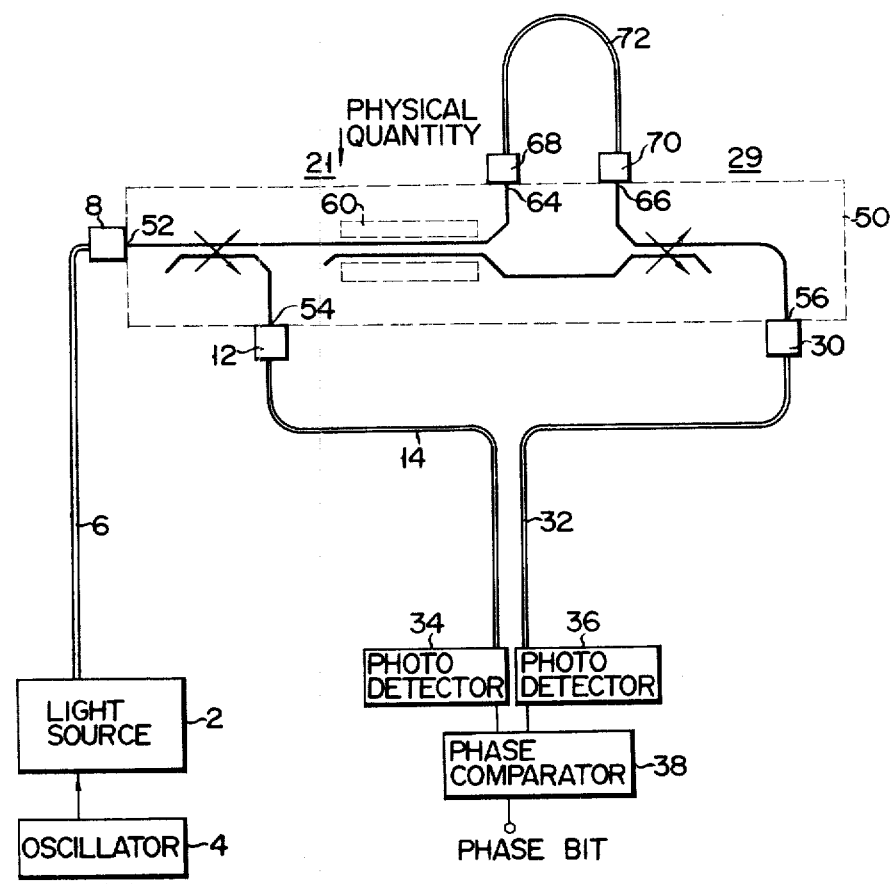
FIG. 11 is a scheme of an example of the optical sensing system shown in FIG. 1 when it is assembled in the integrated manner.

FIG. 11 shows a modification of the optical sensing system shown in FIG. 1, in which some of the optical elements are optically integrated on an optical crystal substrate 50, for example, a LiTaO$_3$ crystal. The optical substrate 50 is provided with a first input port 52 to which the first optical fiber 6 is connected through a launching optics 8, first and second output ports 54 and 56 to which the second and third optical fibers 14 and 32 are connected through the launching optics 12 and 30. Formed within the optical substrate 50 is a 3 dB optical directional coupler 58 which splits the input light beam travelling through the first input port 52 into two light beams with the same light intensities, and transfers to the output port 54 one of the two light beams which serves as a reference optical signal. Formed on the substrate 50, a modulator 60 of the optical directional coupler type modulates the other light beam split from the 3 dB optical directional coupler 58 depending on a physical quantity to be measured. The modulator 60 is discussed in M. Papuchon, "Switching and Coupling in Ti:LiNbO₃ waveguide", Topical Meeting on Integrated Optics, Technical Digest, TuAl, Salt Lake City, Utah U.S.A. (1976). The modulator discussed in the above-mentioned paper is an optical one for changing a distribution ratio of the optical waves applied to two optical waveguides, depending on the physical quantity, for example, the voltage V. The modulator 60 distributes equally the launched light beam into the two optical waveguides, at a given voltage. At a voltage other than the given one, the phases of the light components distributed into both the waveguides are changed dependent on the voltage whereby the light intensities of both the light components passes a voltage-dependent nature. Accordingly, the modulator 60 is different from the sensor 21 already discussed in the physical phenomena with relation to the optical wave, but is substantially identical with the latter in that the light beam is split into two and the separated ones are intensity-modulated. Formed on the substrate 50, a 3 dB optical directional coupler 62 as a light composer has first and second light input waveguides which first and second light components emanated from the modulator 60 are supplied. In order to give a time delay $\tau = (2m+1)/2f$ between the light components travelling through the respective waveguides, the output waveguide of the modulator 60 and the input waveguide of the coupler 62 extend to the third port 64 and the second output port 66. The third output port 64 and the second input port 66 are optically coupled with launching optics 68 and 70, which are optically coupled with each other by means of an optical fiber 72 properly selected. The 3 dB optical directional coupler 62 composes the two light components having the time difference $\tau$, and those are substantially subtracted one from the other. The light beam composed from the coupler 62 is guided into the second output port and, through the launching optics 30 and optical fiber, to the photo-detector 36.

The optical sensing system optically integrated in FIG. 11 may sense a physical quantity by one phase bit, as in the system shown in FIG. 1. The optical sensing system has the integration of some optical elements to be provided in the measuring area. Because of this, increase of the number of the substrates 50 to increase the number of phase bits may be attained with a relatively less increase of the area for installing thereon them. Therefore, this optical sensing system is well adapted for increasing the number of phase bits.

Figure 12:
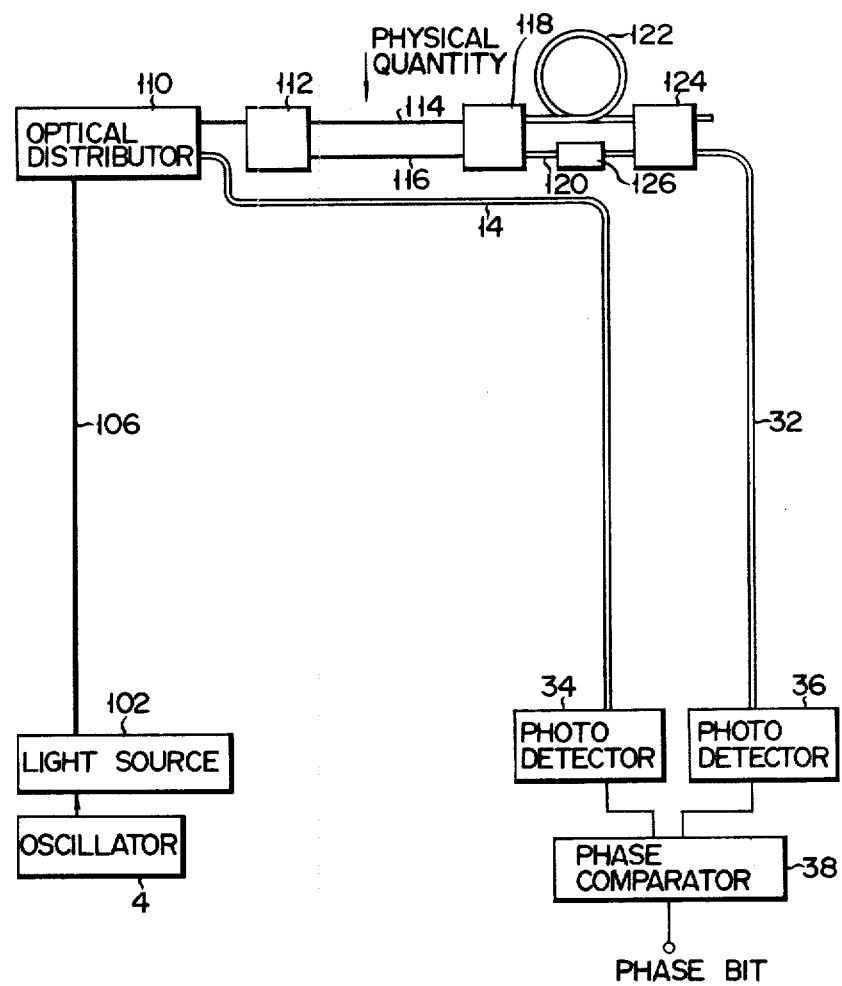
FIGS. 12 and 13 are schemes of other embodiments of the optical sensing system according to the invention.
Figure 13:
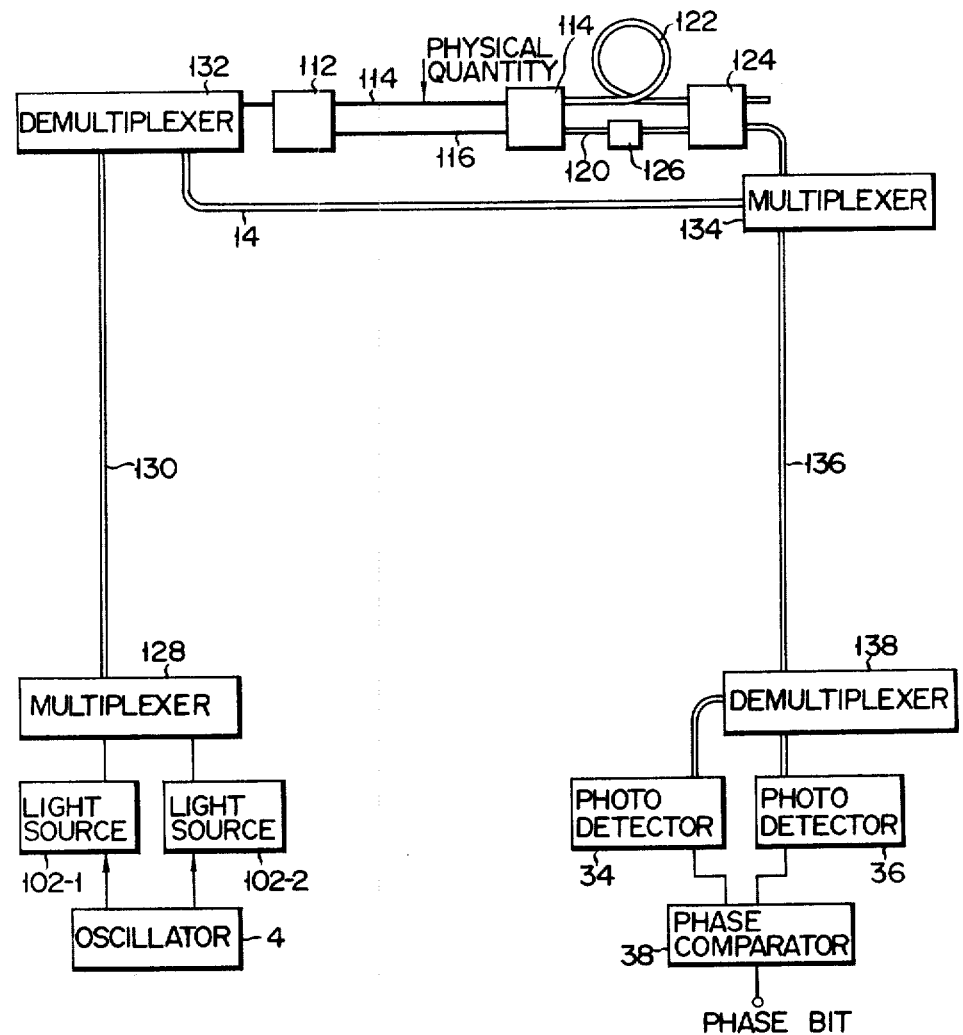

Further continuing the description of the present invention, reference is made to FIGS. 12 and 13 illustrating other embodiments of the present invention. A feature common for these embodiments, different from that in FIG. 1, resides in that a light source 102 for producing the coherent light beam is provided. The coherent light beam from the light source 102 is intensity-modulated by the signal from the oscillator 4 into the light beam with the frequency f as shown in FIG. 2. The intensity modulated light beam is transferred through the single mode fiber 106 to an optical distributor 110, for example, the 3 dB optical directional coupler. The distributor 110 splits the light beam into two light beams. One of the light beams split is transferred as the reference optical signal to the photo-detector 34, through the optical fiber 14. The other light beam is applied to a first 3 dB optical directional coupler 112 where it is again splitted into two light beams. Those two beam components split are transferred to a second 3 dB optical directional coupler 118, through two single mode fibers 114 and 116. One of the single mode fibers 114 and 116 is disposed at a measuring point for measuring a physical quantity such as temperature, pressure or electric field. As known, the single mode fiber has a nature that the refractive index of the core and cladding thereof changes depending on the ambient condition. For this reason, when the beam components with the same phases are projected into two single mode fibers 114 and 116 with the same lengths which are placed in different ambient conditions, there is produced a phase difference $\phi$ between the beam components travelling through the respective single mode fibers. When the two single mode fibers 114 and 116 with different lengths are placed in the same ambient temperature, the phases of the beam components passing therethrough change depending on the ambient physical quantity. Thus, the mere length difference between the fibers 114 and 116 provides a phase difference between the two beam components going through the fibers.

Those beam components of which one has a phase delay $\phi$ with respect to the other, are transferred to the 3 dB optical direction coupler 118 where those components are composed. In this case, the components interfere with each other since those are the coherent light. Those beam components in the coupler 118 are intensity-modulated with the phase difference $\phi$ and the modulated one is sent out from the coupler 118. The light intensities $\lambda_1$ and $\lambda_2$ of the beam components from the coupler 118 are expressed by the following equations (4) and (5).

$$a_1{}^2 \quad \left| \frac{1}{\sqrt{2}} \cdot e^{j\phi} \cdot \frac{1}{\sqrt{2}} \cdot \frac{1}{\sqrt{2}} \cdot e^{j\frac{\pi}{2}} \cdot 1 \cdot \frac{1}{\sqrt{2}} \cdot e^{j\frac{\pi}{2}} \right|^2 \quad (4)$$

$$\sin^2\left(\frac{\phi}{2}\right)$$

$$a_2{}^2 \quad \left| \frac{1}{\sqrt{2}} \cdot e^{j\frac{\pi}{2}} \cdot 1 \cdot \frac{1}{\sqrt{2}} \cdot \frac{1}{\sqrt{2}} \cdot e^{j\phi} \cdot \frac{1}{\sqrt{2}} \cdot e^{j\frac{\pi}{2}} \right|^2 \quad (5)$$

$$\cos^2\left(\frac{\phi}{2}\right)$$

The equations (4) and (5) may be interpreted in the following way. The first term in the equation (4) indicates the beam component transferred through one of the waveguide of the first 3 dB optical directional coupler 112 and one of the waveguide of the second directional coupler 118 coupled with each other. The second term indicates the light component which is leaked from one waveguide of the first 3 dB optical directional coupler to the its other waveguide, and added to the light component of the first term. The first term in the equation (5) indicates the light component transferred through the other waveguides of the first and second 3 dB optical directional couplers 112 and 118. The second term of the equation (5) indicates the light component which is leaked from one of the waveguides of the second coupler 118 to the its other waveguide and is added to the light component of the first term. In those equations (4) and (5), the input optical signal is handled as unit input. $e^{j(\pi/2)}$ in those equations indicates that, when the light beam is distributed by each 3 dB optical directional coupler 112 and 118, a phase difference of $\pi/2$ is produced between the beam components distributed.

As seen from the equations (4) and (5), the beam components supplied from the second 3 dB optical directional coupler 118 have a relation as indicated by the graph in FIG. 3. In other words, two light components from the second coupler 118 are intensity-modulated with the phase difference $\phi_1$, or modulated by a physical quantity to be measured.

The two light beam components from the second coupler 118 are respectively delivered to first and second multi-mode fibers 120 and 122 for reducing a degree of the spatial coherency of the beam components. The first and second multi-mode fibers 120 and 122 are optically coupled with the third 3 dB optical directional coupler 124. The second multi-mode fiber 122, which is longer the first multi-mode fiber 20, has a length so selected that the second light component transmitted through the fiber 122 is delayed by a time $\tau(=(2m+1)/2f)$ from the first light component transmitted through the first multi-mode fiber 120. The first or second multi-mode fiber 120 or 122 has an optical attenuator 126 inserted therein to equalize the intensities of the two light components transferred to the third 3 dB optical directional coupler 124 with the modulation phase $\phi=\pi/2$. In the third 3 dB optical directional coupler 124, the two light components are composed, that is, the optical powers are substantially subtracted one from the other, as previously described referring to the equations (1) and (2). Accordingly, the third coupler 124 supplies an optical signal of the phase bit to the photo-detector 36.

The embodiment shown in FIG. 12 uses the multimode fibers 120 and 122 for reducing the spatial coherency of the beam components from the second 3 dB optical directional coupler 118. When the fibers 120 and 122 are each than the coherent length of the coherent light source, those may be replaced by single mode fibers. The reason for this is that, under this condition, the time coherency of the light beam components may be reduced and thus the subtraction process of the optical powers in the third coupler 124 is little influenced.

A modification of the optical sensing system shown in FIG. 12 is illustrated in FIG. 13. The modification has a first light source 102-1 for producing a light beam with the wavelength $\lambda_1$ to be modulated by a physical quantity to be measured and a second light source 102-2 for producing a light beam with the wavelength $\lambda_2$ to be phase-compared with the light beam of $\lambda_1$. The two light beams emanating from those light sources are intensity-modulated by the oscillating signal having a frequency f generated from the oscillator 4 and the intensity-modulated light beams are transferred to a wavelength multiplexer 128, for example, a diffraction grating. The light beam from the multiplexer 128 is supplied to the wavelength demultiplexer 132, for example, a diffraction grating through the multi-mode fiber 130. In the wavelength demultiplexer 132, the multiplexed light beam are again demultiplexed into two light beams with the wavelengths $\lambda_1$ and $\lambda_2$. The light beam of $\lambda_2$ as a reference light beam is transferred again to the wavelength multiplexer 134, through the optical fiber 14. The light beam of the wavelength $\lambda_1$ is divided into two beams of light, modulated by the physical quantity to be measured, is subtracted in their powers, and is finally applied to the wavelength multiplexer 134, as in the system of FIG. 11. The light beams of $\lambda_1$ and $\lambda_2$ are multiplexed by the multiplexer 134 and is led to a multi-mode fiber 136. The light beam from the 136 is supplied to the wavelength demultiplexer 138 where it is demultiplexed into two light beams of $\lambda_1$ and $\lambda_2$. The two demultiplexed ones are supplied to the photo-detectors 34 and 36.

In the embodiment shown in FIG. 13, different wavelengths are employed for the reference optical signal and for the optical signal to be modulated, the single optical waveguide is used for transmission of both the signals when it is transmitted to and from the measuring place. The features enables the optical waveguide to be substantially saved in a remote sensing system.

The optical sensing system shown in FIGS. 11 and 12, is also expandable to increase the number of the phase bits, as in the system of FIGS. 7 and 10. Further, it is evident that the optical elements may be integrated in the fabrication, as in the case of FIG. 11.

As seen from the foregoing, since the measured data is transferred in the form of the phase bit, there is no fear that an error of the measured data is caused by the attenuation of the optical signal, whereby there is provided an optical sensing system capable of providing accurate and reliable measured data.

What is claimed is:

1. An optical sensing system comprising:
    means for generating an input optical signal whose intensity is modulated by an oscillating input signal with a fixed frequency f;
    first means for transferring the input optical signal;
    sensing means for splitting the input optical signal into two light components, the splitting ratio between the two light components being varied by a physical quantity to be sensed;
    optical power subtracting means for providing a time delay $\tau = (2m+1)/2f$ (m = 0, 1, 2, ... n) between the two light components and composing the two light components to supply an output optical signal having an intensity difference between the two light components modulated by the frequency f;
    second means for transferring the output optical signal;
    means for detecting the output optical signal supplied from the second means; and
    means for comparing the phase of the output optical signal with that of the input signal to generate an in-phase signal or an out-of-phase signal.

2. An optical sensing system according to claim 1, wherein said means for generating the input optical signal produces an incoherent light beam.

3. An optical sensing system according to claim 2, wherein said sensing means is comprised of a polarizer for linearly polarizing the light beam of the input optical signal launched, a sensor for elliptically polarizing the linearly polarized light beam depending on the physical quantity, and an analyzer for splitting the light beam elliptically polarized by said sensor into two light components linearly polarized.

4. An optical sensing system according to claim 1, wherein said optical sensing system includes means for detecting the input optical signal as a reference optical signal from said generating means.

5. An optical sensing system according to claim 1, wherein said sensing means includes a number of sensors with a number of different modulation characteristics to which substantially the same physical quantities to be measured are applied, said optical power subtracting means includes a number of optical subtracters optically coupled with said corresponding sensors, said detecting means includes a number of detectors for detecting the light beams of the output signal supplied from said optical subtracters, and a number of comparators for comparing the detected signals with the input signals, and said first means for transferring said light beam include a star coupler for splitting the light beam of the input optical signal into a number of input light beams and for transferring them to said sensors.

6. An optical sensing system according to claim 1, wherein said light beam generating means includes a number of light sources for producing light beams with different wavelengths whose intensity are modulated, said first means for transferring the light beam includes a multiplexer for multiplexing the light beams with different wavelengths, an optical waveguide for transferring the light beam multiplexed, and a demultiplexer for demultiplexing the light beam transferred, said sensing means includes a number of sensors for modulating the light beams with different wavelengths supplied from said demultiplexer, said optical power subtracting means includes a number of optical subtracters optically coupled with said sensors, said second means for transferring said light beams includes a multiplexer for multiplexing the output light beams with different wavelengths supplied from said optical subtracters, a waveguide for transferring the light beam multiplexed, and a demultiplexer for demultiplexing the light beam transferred, and said detecting means includes a number of detectors for detecting the output light beams with different wavelengths supplied from said demultiplexer and a comparator for comparing the detected signal with the input signal.

7. An optical sensing system according to claim 1, wherein said optical power subtracting means includes a reflecting optical path which elongates one of the light component optical paths relative to the other by a predetermined length.

8. An optical sensing system according to claim 1, wherein said sensing means is a 3 dB optical directional coupler.

9. An optical sensing system according to claim 1, wherein said optical power subtracting means includes an optical fiber which elongates one of the light component optical paths relative to the other by a predetermined length.

10. An optical sensing system according to claim 9, wherein said optical power subtracting means includes a 3 dB optical directional coupler for composing both the light beam components.

11. An optical sensing system according to claim 8 or 9, wherein said 3 dB optical directional coupler is integrated onto an optical substrate.

12. An optical sensing system according to claim 1, wherein said sensing means includes a couple of single-mode optical fibers through which two light components are transferred, and at least one of said fibers is supplied with a physical quantity to be measured.

13. An optical sensing system according to claim 12, wherein the lengths of said optical fibers are different from each other.

14. An optical sensing system according to claim 1, wherein said input optical signal generating means produces a coherent light beam, said subtracting means includes multi-mode optical fibers with different lengths for transmitting both the light components.

15. An optical sensing system according to claim 1, wherein said input optical signal generating means produces a coherent light beam and said optical power subtracting means includes single-mode optical fibers with different lengths for transmitting both the light components, which are each longer than the coherent length of the coherent light source.

16. An optical sensing system according to claim 14 or 15, wherein said optical power subtracting means includes a light attenuator optically coupled with either of said optical fiber for adjusting the light intensities of the two light components.

17. An optical sensing system according to claim 1, wherein said input optical signal generating means is comprised of two light sources for producing two light beams with different wavelengths, said first means is comprised of a multiplexer for multiplexing the light beams with different wavelengths, an optical fiber for transmitting the multiplexed light beam, and a demultiplexer for demultiplexing the light beam transmitted and for supplying the light beam with one of the wavelengths to said sensing means, said second means for transferring said light beam is comprised of a multiplexer for multiplexing an output light beam with one of the wavelengths modulated by said sensing means and an input light beam with the other light beam transmitted from said multiplexer, an optical fiber for transmitting the light beam multiplexed and a demultiplexer for demultiplexing the light beam supplied through said fiber, and said detecting means includes photo-detectors for detecting the light intensities with different wavelengths supplied from said multiplexer, and a comparator for phase-comparing two signals supplied from said photo-detectors.

* * * * *